(12) United States Patent
Lee et al.

(10) Patent No.: US 7,622,369 B1
(45) Date of Patent: Nov. 24, 2009

(54) DEVICE ISOLATION TECHNOLOGY ON SEMICONDUCTOR SUBSTRATE

(75) Inventors: Woo Jin Lee, Tama (JP); Atsuki Fukazawa, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 12/130,522

(22) Filed: May 30, 2008

(51) Int. Cl.
| | |
|---|---|
| H01L 21/76 | (2006.01) |
| H01L 21/36 | (2006.01) |
| H01L 21/20 | (2006.01) |
| H01L 21/205 | (2006.01) |
| H01L 21/469 | (2006.01) |

(52) U.S. Cl. .................. 438/485; 438/424; 438/425; 438/426; 438/427; 438/428; 438/435; 438/487; 438/589; 438/787; 438/788; 257/E21.545; 257/E21.546; 257/E21.548; 257/E21.549; 257/E21.55

(58) Field of Classification Search .......... 257/E21.545, 257/E21.546, E21.548, E21.549, E21.55, 257/E21.655

See application file for complete search history.

(56) References Cited

U.S. PATENT DOCUMENTS

| | | | |
|---|---|---|---|
| 5,393,815 | A | 2/1995 | Takeda et al. |
| 5,487,920 | A | 1/1996 | Lopata et al. |
| 5,922,411 | A | 7/1999 | Shimizu et al. |
| 6,352,945 | B1 | 3/2002 | Matsuki et al. |
| 6,383,955 | B1 | 5/2002 | Matsuki et al. |
| 6,403,486 | B1 | 6/2002 | Lou |
| 6,410,463 | B1 | 6/2002 | Matsuki |
| 6,432,846 | B1 | 8/2002 | Matsuki et al. |
| 6,436,822 | B1 | 8/2002 | Towle |
| 6,455,445 | B2 | 9/2002 | Matsuki |
| 6,514,880 | B2 | 2/2003 | Matsuki et al. |
| 6,740,602 | B1 | 5/2004 | Hendriks et al. |
| 6,784,123 | B2 | 8/2004 | Matsuki et al. |
| 6,818,570 | B2 | 11/2004 | Matsuki et al. |

(Continued)

FOREIGN PATENT DOCUMENTS

EP    1 225 194 A2    7/2002

(Continued)

OTHER PUBLICATIONS

A. J. Kalkman et al., $SiOF_x$ and $SiO_2$ deposition in an ECR-HDP reactor: Tool characterization and film analysis, Microelectronic Engineering 37-38(1999) 271-276.

*Primary Examiner*—Savitri Mulpuri
*Assistant Examiner*—Mohsen Ahmadi
(74) *Attorney, Agent, or Firm*—Knobbe Martens Olson & Bear LLP

(57) ABSTRACT

A method of forming device isolation regions on a trench-formed silicon substrate and removing residual carbon therefrom includes providing a flowable, insulative material constituted by silicon, carbon, nitrogen, hydrogen, oxygen or any combination of two or more thereof; forming a thin insulative layer, by using the flowable, insulative material, in a trench located on a semiconductor substrate wherein the flowable, insulative material forms a conformal coating in a silicon and nitrogen rich condition whereas in a carbon rich condition, the flowable, insulative material vertically grows from the bottom of the trenches; and removing the residual carbon deposits from the flowable, insulative material by multi-step curing, such as O2 thermal annealing, ozone UV curing followed by N2 thermal annealing.

16 Claims, 6 Drawing Sheets

U.S. PATENT DOCUMENTS

| | | |
|---|---|---|
| 6,835,664 B1 | 12/2004 | Sarigiannis et al. |
| 6,881,683 B2 | 4/2005 | Matsuki et al. |
| 6,890,869 B2 | 5/2005 | Chung |
| 7,064,088 B2 | 6/2006 | Hyodo et al. |
| 7,354,873 B2 | 4/2008 | Fukazawa et al. |
| 2001/0055889 A1 | 12/2001 | Iyer |
| 2003/0100175 A1 | 5/2003 | Nobutoki et al. |
| 2003/0194880 A1 | 10/2003 | Singh et al. |
| 2004/0137757 A1 | 7/2004 | Li et al. |
| 2005/0129932 A1 | 6/2005 | Briley |
| 2005/0139542 A1* | 6/2005 | Dickensheets et al. ...... 210/490 |
| 2006/0014399 A1 | 1/2006 | Joe |
| 2006/0110931 A1 | 5/2006 | Fukazawa et al. |
| 2006/0148273 A1* | 7/2006 | Ingle et al. .................. 438/787 |
| 2006/0228866 A1 | 10/2006 | Ryan et al. |
| 2006/0240652 A1 | 10/2006 | Mandal |
| 2006/0258176 A1 | 11/2006 | Fukazawa et al. |
| 2007/0004204 A1 | 1/2007 | Fukazawa et al. |
| 2007/0065597 A1 | 3/2007 | Kaido et al. |
| 2007/0289534 A1 | 12/2007 | Lubomirsky et al. |
| 2008/0076266 A1 | 3/2008 | Fukazawa et al. |
| 2008/0166888 A1* | 7/2008 | Hsu et al. .................... 438/787 |
| 2008/0305648 A1 | 12/2008 | Fukazawa et al. |

FOREIGN PATENT DOCUMENTS

| | | |
|---|---|---|
| JP | 2006-054353 | 2/2006 |

* cited by examiner

DEVICE ISOLATION TECHNOLOGY ON SEMICONDUCTOR SUBSTRATE

BACKGROUND OF THE INVENTION

1. Field of the Invention

The present invention relates to the field of semiconductor integrated circuit manufacturing and, more particularly to a method of forming device isolation regions on a semiconductor substrate by using PECVD and to a method of removing residual carbon deposits from an intermediate semiconductor device structure.

2. Description of the Related Art

Integrated circuits fabricated on semiconductor substrates for large scale integration require multiple levels of metal interconnections to electrically interconnect the discrete layers of semiconductor devices on the semiconductor chips. Today several million devices can be fabricated in a single chip, for example, the mega-bit memory chips which are commonly used today in personal mobile and in other applications.

Devices of semiconductor typically include semiconductor substrate and a plurality of adjacent, active devices that are electrically isolated from one another. With the increased circuit density, effective isolation between active devices becomes increasingly important. One isolation technique is local oxidation of silicon isolation (LOCOS), which forms a recessed oxide layer in non-active regions of the semiconductor substrate to isolate the active devices. The oxide layer is conventionally formed by patterning a hard mask and thermal oxidation of the substrate.

The above described conventional LOCOS technique has a number of disadvantages, which become rather unacceptable when attempting to apply this technique to the fabrication of sub-micron devices. First, the oxidization of silicon happens not only in the vertical direction but also in the horizontal direction. As a result, a part of the field oxide grows under adjacent silicon nitride or other hard mask layers and lifts it up. This is termed the "bird's beak effect" by persons skilled in the art. Secondly, due to the stresses caused by the bird's beak effect, a part of nitride hard mask in the compressed regions of silicon nitride layer diffuses to adjacent tensile strained regions at the interface of the pad oxide layer and the substrate, and forms a silicon-nitride-like region. In subsequent process steps of forming gate oxides, due to the mask effect of the silicon-nitride-like layer, the gate oxides will be thinner than they should be. This is termed the "white ribbon effect" because a white ribbon will appear at the edges of active regions under optical microscopes.

An alternative technique is trench isolation, which involves etching trenches in nonactive regions of a semiconductor substrate. Trench isolation is referred to as shallow trench isolation (STI) or deep trench isolation (DTI), depending on the depth of the trench etched in the semiconductor substrate. DTI structures, which typically have a depth of greater than approximately 3 microns, are used to isolate active devices such as N-wells and P-wells. Shallow trench structures are used to isolate adjacent electronic devices, such as transistors, and often have a depth of less than approximately 1 micron. The trenches are filled with a deposited insulative dielectric material, such as a silicon dioxide material. The filled trenches are known in the art as trench isolation or trench isolation regions. The trench is typically filled with the silicon dioxide material by a chemical vapor deposition (CVD) technique, such as high density plasma CVD. In CVD, gaseous precursors of the silicon dioxide material are supplied to a surface of the semiconductor substrate. The gaseous precursors react with the surface to form a film or layer of the silicon dioxide material.

Trench isolation provides a smaller isolation area and better surface planarization than LOCOS. While trench isolation provides these advantages, undesirable voids can be formed in the silicon dioxide material as the trench fills because the silicon dioxide material tends to stick to the sides and sidewalls of the trench, rather than evenly filling the trench from the bottom to the top. Voids are especially common in deep trenches, such as trenches having a high aspect ratio (depth: width) of greater than approximately 3:1. Voids also commonly form at later stages of the filling process because the trenches, both deep and shallow, become narrower as they fill.

Recently, CVD of flowable oxide material has been developed to reduce the formation of voids. An organic doped silicon oxide film is formed in trenches by supplying a liquid silicon precursor which includes a methyl or ethyl group bond. Often the precursor is supplied while spinning the substrate, such that the resultant process or material is referred to as SOD for spin-on deposition or spin-on dielectric. Furthermore, as the technology shrinks nodes to 45 nm and beyond, the demands for not only gap-filling, but also conformal coating are ever increasing.

In addition, while depositing the flowable oxide material, residual carbon deposits are present in the deposited film if the precursors contain carbon. Carbon in the deposited film causes the film to be soft and porous, which makes the deposited film unstable during subsequent processing, such as etching processes. Also, if the flowable oxide material is used to fill isolation trenches within the semiconductor substrate, the carbon cause device degradation.

SUMMARY OF THE INVENTION

An object of the disclosed embodiments of the present invention, among other objects, is to provide a method of forming device isolation for an integrated circuit and to provide a method of removing residual carbon deposits at low temperatures (e.g., <500° C.). The methods described herein provide control over both filling and conformal coating in trenches. In an embodiment, this method comprises: providing a flowable, insulative material comprising silicon, carbon, nitrogen, hydrogen, oxygen or any combination of two or more thereof; and forming a thin insulative layer, by using the flowable, insulative material, in a trench located on a semiconductor substrate. The method allow deposition wherein the flowable, insulative material grows in a conformal manner in a silicon and nitrogen rich condition, whereas in a carbon rich condition, the flowable, insulative material grows in trenches vertically from the bottom of the trenches, without lateral deposition. By such methods, field insulative materials (preferably of substantially the same thickness) can be formed in trenches of different sizes. In another embodiment, the method further comprises removing residual carbon deposits from the flowable, insulative material by multi-step curing, such as oxygen-containing treatment at a temperature of between approximately 100° C. and 500° C., ozone exposure by UV curing, followed by thermal annealing at a temperature of between approximately 100° C. and 500° C. in a non-oxidizing atmosphere of, e.g., $N_2$.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

In an embodiment, a flowable, insulative material is used as a gap fill material, such as to fill a trench on a semiconductor substrate. The flowable, insulative material is deposited into the trench to form an insulative layer, which includes residual carbon deposits. The semiconductor substrate may be a semiconductor wafer or other substrate comprising a layer of semiconductor material. As used herein, the term "semiconductor substrate" includes, but is not limited to, silicon wafers, silicon on insulator (SOI) substrates, silicon on sapphire substrates, epitaxial layers of silicon on a base semiconductor foundation, and other semiconductor materials such as silicon-germanium, germanium, gallium arsenide and indium phosphide.

The disclosed embodiments of the present invention will be explained with reference to drawings and preferred embodiments. However, the drawings and preferred embodiments are not intended to limit the present invention.

Figure 1A:
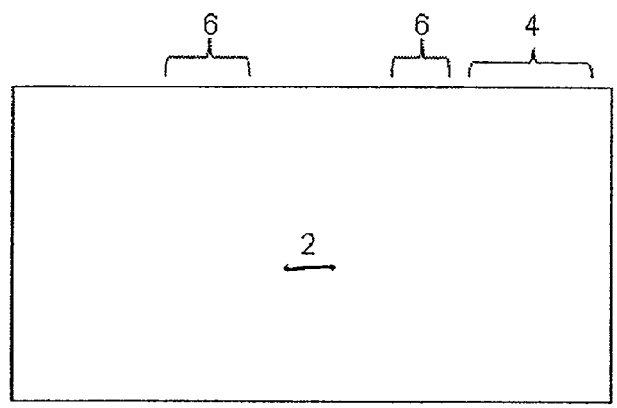
FIGS. 1A to 1D are schematic cross-sectional views showing steps of conformal deposition according to an embodiment of the present invention.

As shown in FIG. 1A, a semiconductor substrate 2 may include a plurality of active regions 4 and a plurality of nonactive regions 6. Active devices, such as transistors, may be formed on the active regions 4 while at least one trench 8 (FIG. 1B) may be formed on the nonactive regions 6 to separate and isolate the active devices. In this embodiment, the term "trench" is used in its broadest sense of a recess or cavity and is not to be construed as requiring any specific configuration or dimension. As such, the trench may be either a shallow trench or a deep trench. In another embodiment, the term "trench" may carry its ordinary and customary meaning.

Figure 1B:
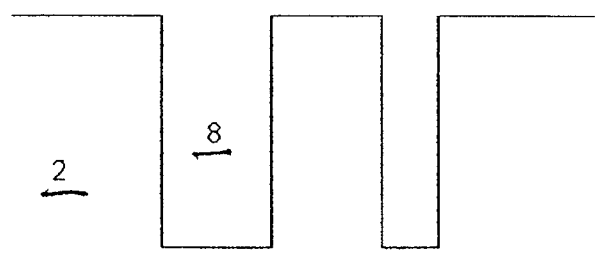

As presented in FIG. 1B, the trenches 8 may be formed in the nonactive regions 6 of the semiconductor substrate 2 by any suitable techniques including conventional techniques, such as by masking and etching the semiconductor substrate 2. As is known in the art, additional layers may be present on the semiconductor substrate 2 depending on the nature and/or its intended use of an ultimate semiconductor device structure that is to be formed. For the sake of example only, photoresist layers, pad oxide layers, and/or nitride layers may be present on the semiconductor substrate 2, in a manner known in the art, but are not shown for the sake of simplicity.

Figure 1C:
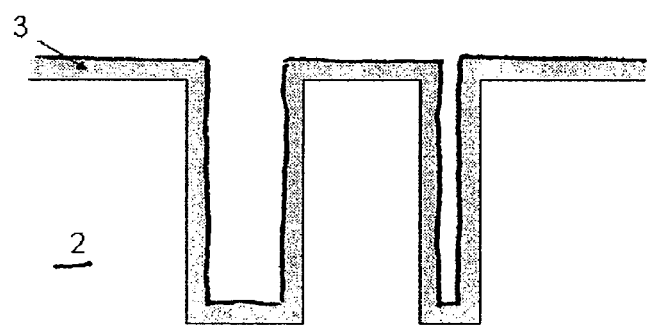
Figure 1D:
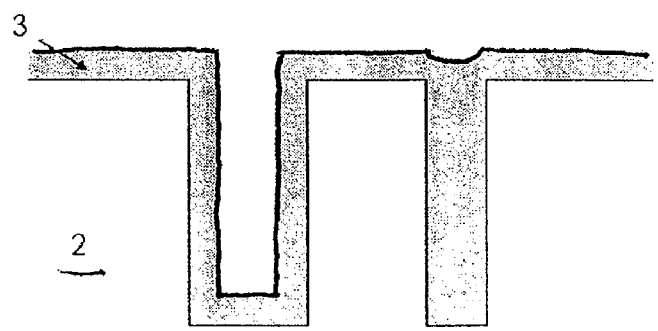

As shown FIG. 1C, an insulative layer 3 is deposited conformably on the trenches 8. The insulative layer 3 may be deposited in such a way as to completely fill in a narrow trench (e.g., a width of 5 nm to 90 nm; an aspect ratio of 4 to 70) and be deposited conformably in a wide trench (e.g., a width of 90 nm to 700 nm; an aspect ratio of 0.5 to 4) as shown FIG. 1D. In another embodiment, a narrow trench has a width of 3 nm to 30 nm and an aspect ratio of 4 to 15, and a wide trench has a width of 30 nm to 60 nm and an aspect ratio of 0.5 to 4. The conformal deposition process of FIGS. 1C-1D is described in more detail below.

Figure 2:
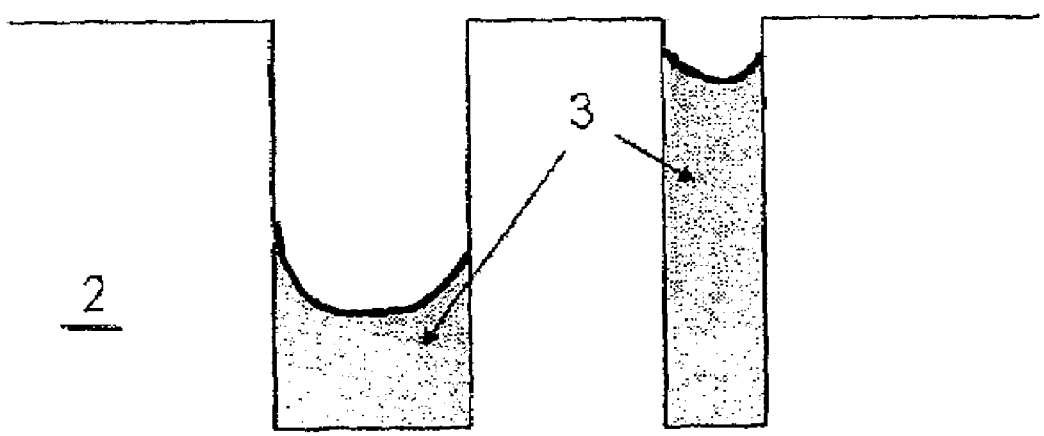
FIG. 2 is a schematic cross-sectional view showing steps of flow fill according to an embodiment of the present invention.

Referring to FIG. 2, the insulative layer 3 also can completely or partially fill the trench by a vapor phase deposition process by controlling the amount of additives (e.g., hydrocarbon solvents such as benzene, toluene, n-hexane, cyclohexane and the like, or any two or more of the foregoing at an amount of 40 sccm to 400 sccm, or 400 sccm to 1600 sccm relative to the total gaseous precursor flow). The insulative layer 3 may be deposited at a thickness ranging from approximately 50 Å to 8000 Å, including a thickness of approximately 300 Å to 3000 Å. The bottom-up deposition process of FIG. 2 is described in more detail below.

In an embodiment, the insulative layer may be formed from a flowable oxide material that is deposited by, for example, plasma enhanced chemical vapor deposition (PECVD). The semiconductor substrate 2 may be placed in a reaction chamber and gaseous precursors flow over the semiconductor substrate 2 and into the trench 8. The gaseous precursors may include, but are not limited to, $Si_xH_y$ and a solvent, or $Si_xH_y$ and an organic silicon precursor, both of which are gaseous at, or near, a temperature at which the insulative layer 3 is deposited ($Si_xH_y$ denoted one or more of any suitable silanes including $Si_nH_{2n+2}$). Examples of the solvent may be one or more solvents selected from the group consisting of hydrocarbon solvents such as benzene, toluene, n-hexane, cyclohexane and the like, and ether solvents such as n-butyl ether, tetrahydrofuran, dioxane and the like. In this connection, however, any solvents may be used if such solvents are stable in or inert to the reaction system. The organic silicon precursor may be one or more precursors selected from the group consisting of silicon, carbon, hydrogen, nitrogen, and, optionally, oxygen. For instance, the organic silicon precursor may be an organosilane or an organosilazane. The organosilazane may include, but is not limited to, a tetramethyldisilazane (TMDSZ), hexamethyl-cyclotrisilazane, octamethylcylrotetrasilazane. It is also contemplated that a mixture of two or more organic silicon precursors may be used. In an embodiment, a combination of organic silicon precursor and solvent can be used. Further, an inert gas such as $N_2$, He, and/or Ar can be used. In the above, when the process gas does not contain nitrogen, a nitrogen-containing gas may be added.

In embodiments, a silicon-containing gas, a nitrogen-containing gas, and a carbon-containing gas are used, provided that at least two different compounds constitute the silicon-containing gas, the nitrogen-containing gas, and the carbon-containing gas, such that relative ratios of film constituents in the feed gas can be modulated. Compounds that include a plurality of the depositing elements (e.g., $(CH_3)SiN_3$ can be used in certain embodiments. In an embodiment, an oxidizing gas such as $O_2$ or $O_3$ is added. In another embodiment, no oxidizing gas is used. In an embodiment, no inert gas is used. By adjusting the flow rate of each gas, it is possible to control the formation of a depositing film: In a silicon and/or nitrogen rich condition, the formation of a deposition film can be controlled to result in conformal coating, whereas in a carbon rich condition, the formation of a depositing film can be controlled to result in vertical or bottom-up growth.

In an embodiment, a silicon source gas containing no nitrogen or carbon, a hydrocarbon solvent gas containing no nitrogen or silicon, and a nitrogen gas containing no silicon or carbon are used. In another embodiment, a silicon source gas containing no nitrogen or carbon, an organo-silicon gas containing nitrogen, and a nitrogen source gas containing no silicon or carbon are used. As the nitrogen-containing gas or nitrogen source gas, $N_2$, $NH_3$, and/or $NF_3$ can be used.

Deposition conditions in embodiments may be as follows:

$Si_xH_y$ (SiH): 5 to 200 sccm (preferably 10 to 100 sccm)

Organic Solvent (OS): 40 to 1600 sccm (preferably 80 to 800 sccm)

Organic Silicon Precursor (OSP): 10 to 400 sccm (preferably 20 to 200 sccm)

Nitrogen Source Gas (NSG): 20 to 1000 sccm (preferably 50 to 500 sccm)

Inert Gas (IG): 300 to 2000 sccm (preferably 500 to 1000 sccm)

Oxidizing Gas: 0 to 1000 sccm

Flow Ratio of OS/SiH: 0.2 to 320 (preferably 2 to 10)

Flow Ratio of OSP/SiH: 0.05 to 80 (preferably 0.5 to 3)

Flow Ratio of (OS or OSP)/NSG: 0.01 to 80 (preferably 0.1 to 2.0)

Temperature: 0 to 200° C. (preferably 0 to 50° C.)

Pressure: 0.1 to 10 Torr (preferably 1 to 5 Torr)

RF Power: 10 to 1000 W (preferably 50 to 500 W) at (430 kHz to 13.56 MHz)

In the above, by adjusting the flow ratios of (OS or OSP)/SiH, NSG/SiH, and/or (OS or OSP)/NSG, it is possible to control the formation of a depositing film between conformal coating and vertical growth. For example, if conformal coating is preferable over vertical growth, the ratio of (OS or OSP)/SiH and/or (OS or OSP)/NSG is increased; if vertical growth is preferable over conformal coating, the ratio of (OS or OSP)/SiH and/or (OS or OSP)/NSG is decreased. Thus a deposition recipe can be provided with a ratio selected for conformal deposition, and by decreasing the aforementioned ratios related to the conformal recipe, a second, vertical deposition can be obtained. In some embodiments, conformal deposition precedes vertical or bottom-up deposition, such that both recipes can be used on a single substrate, with different effects on differently sized trenches or vias.

The insulative layer 3 deposited by PECVD may contain residual carbon deposits if the carbon contained in the organic silicon precursor or solvent is not completely oxidized during the PECVD process. The insulative layer 3 may include up to approximately 30% carbon. The presence of carbon causes the insulative layer 3 to be soft and porous, which may lead to collapse of the insulative layer 3 under certain conditions. In addition, when the insulative layer 3 is used to fill trenches, the carbon may cause degradation in any semiconductor device structures that include the insulative material.

In an embodiment, the residual carbon deposits may be removed from the insulative layer 3 by multi-step curing. The multi-step curing may include oxygen-containing treatment, oxygen UV curing, and thermal annealing. In an embodiment, the multi-step curing specifically consists of the above in the listed sequence or order. These steps can be conducted consecutively or continuously. The curing sequence can be useful for carbon-containing oxide films formed by the above PECVD processes, or for films formed by other processes (e.g., thermal CVD, spin-on deposition using liquid precursors, etc.).

First, during the oxygen-containing treatment, the oxygen-containing gas may be introduced or arranged to flow into the reactor during baking so that residual carbon is released to a certain extent and the silicon-oxide structure is rearranged. The oxygen-containing gas can include, but is not limited to, $O_2$, $O_3$ and/or $N_2O$. Further, nitrogen gas or nitrogen-containing gas can be added.

During the oxygen-containing treatment, which is also referred to as baking (without UV irradiation), the semiconductor substrate 2 may be maintained at a temperature ranging from approximately 100° C. to approximately 400° C. (including a range of 300 to 400° C.). Nitrogen may be arranged to flow into the reaction chamber at a rate of at least 10 sccm and up to a rate of approximately 5,000 sccm (including a range of 100 to 3,000 sccm, or 500 to 2,000 sccm). Oxygen may be arranged to flow into the reaction chamber at a rate of at least 10 sccm and up to a rate of approximately 10,000 sccm (including a range of 100 to 5,000 sccm, or 500 to 3,000 sccm). In an embodiment, the oxygen-containing treatment comprises treating the conformal/flowable, insulative layer with nitrogen/oxygen, hydrogen/oxygen and/or $H_2O$/oxygen steam at a temperature of between about 100° C. and about 400° C. The oxygen-containing treatment can be conducted at a pressure of 1 to 9 Torr for 5 to 20 minute.

Second, during the oxygen UV curing, nitrogen and oxygen may be introduced or arranged to flow into the reaction chamber while a UV lamp is ON so that reactive oxygen or ozone contacts the insulative layer 3 in the trench 8 for a sufficient amount of time to remove the residual carbon. The reactive oxygen or ozone may permeate the layer and come into contact with the residual carbon deposits. Although the following theory is not intended to limit the present invention, it is believed that the oxygen or ozone oxidizes the residual carbon deposits to produce volatile carbon species, such as carbon monoxide or carbon dioxide. These volatile carbon species subsequently diffuse out of the insulative layer 3. The exposure of the insulative layer 3 to oxygen or ozone may dramatically reduce the amount of residual carbon present in the insulative layer 3 from approximately 40 atomic % to less than approximately 1 atomic %. Subsequently, nitrogen or oxygen may be introduced or arranged to flow into the reactor during annealing so that remaining impurities, such as —OH can be removed and the insulative layer 3 may be substantially free of impurities. As the oxidizing gas, $O_2$, $O_3$ and/or $N_2O$ can be used.

For oxygen UV curing, the semiconductor substrate 2 may be maintained at a temperature ranging from approximately 0° C. to approximately 500° C. (including a range of 100 to 300° C.). Nitrogen gas or nitrogen-containing gas may be arranged to flow into the reaction chamber at a rate of at least 10 sccm and up to a rate of approximately 5,000 sccm (including a range of 100 to 3,000 sccm, or 500 to 2,000 sccm). Oxygen gas or oxygen-containing gas may be arranged to flow into the reaction chamber at a rate of at least 10 sccm and up to a rate of approximately 10,000 sccm (including a range of 100 to 5,000 sccm, or 500 to 3,000 sccm). The UV lamp may have a wavelength ranging from approximately 130 nm to approximately 400 nm with intensity of 50~200 mW/cm². The insulative layer 3 may be exposed to the UV for between approximately 5 seconds and approximately 1 hour (including range 2 minutes to 10 minutes) at a pressure of 2 Torr to 9 Torr. To improve the amount of carbon removed from the insulative layer 3, the oxygen concentration and/or the UV irradiation time may be increased.

In an embodiment, during the UV curing, nitrogen and oxygen are arranged to flow into the reaction chamber maintained with a susceptor temperature of approximately 400°

C., at a rate of approximately 1,000 sccm and 3,000 sccm, respectively. To remove the residual carbon, the insulative layer 3 may be exposed to the UV for as little as approximately 10 seconds.

During the thermal annealing, the semiconductor substrate 2 may be maintained at a temperature ranging from approximately 100° C. to approximately 500° C. (including a range of 300 to 450° C.). For the sake of example only, the semiconductor substrate 2 may be maintained at 400° C. Nitrogen gas or nitrogen-containing gas may be arranged to flow into the reaction chamber at a rate of at least 10 standard cubic centimeters per minute (sccm) and up to a rate of approximately 5,000 sccm (including a range of 100 to 3,000 sccm, or 500 to 2,000 sccm). Oxygen gas or oxygen-containing gas may be arranged to flow into the reaction chamber at a rate of at least 10 sccm and up to a rate of approximately 10,000 sccm (including a range of 100 to 5,000 sccm, or 500 to 3,000 sccm).

The disclosed embodiments of the present invention will be more precisely described with reference to preferred examples, which should not be construed as examples limiting the present invention.

In the present disclosure where conditions and/or structures are not specified, the skilled artisan is the art can readily provide such conditions and/or structures, in view of the present disclosure, as a matter of routine experimentation. Also, in the present disclosure, the numerical numbers applied in embodiments can be modified in other embodiments (e.g., by expanding the disclosed ranges by ±50%), and the ranges applied in embodiments may include or exclude the endpoints.

EXAMPLE 1

With reference to the features of FIGS. 1 and 2, an insulative layer 3 was formed by introducing $SiH_4$, n-hexane and nitrogen gas into a reaction chamber for CVD processing wherein a semiconductor substrate 2 having trenches 8 was placed. The trenches included relatively wide trenches (a width of 500 m and a depth of 350 nm) and relatively narrow trenches (a width of 50 nm and a depth of 350 nm). The flow rates of $SiH_4$, n-hexane, and nitrogen gas are shown in Table 1. No oxidizing gas was used. RF power (a frequency of 13.56 MHz, 200 W) was applied to generate plasma over the substrate 2. The $SiH_4$ and solvent reacted in the presence of the inert gas on the surface of the semiconductor substrate 2 having the trenches 8 to form the insulative layer 3. The semiconductor substrate 2 may be maintained at a temperature ranging from approximately 0° C. to 200° C. by placing the semiconductor substrate 2 on a chuck maintained at that temperature. In this example, the semiconductor substrate 2 was maintained at a temperature of approximately 30° C. The reaction chamber may be maintained at a pressure ranging from approximately 2 Torr to approximately 10 Torr (in this example, at approximately 3 Torr). The thickness of the deposited film (as measured on a flat surface) was from 30 nm to 300 nm. After completion of the deposition, the trenches were observed with a scanning electron microscope.

The process conditions and the formation type of resultant insulative layer are indicated in Table 1. As shown in Table 1, the hydrocarbon flow rate (n-hexane) relative to the silicon flow rate ($SiH_4$) and the nitrogen flow rate ($N_2$) affects the formation type of depositing film.

TABLE 1

| Example | $SiH_4$ (sccm) | Hexane (sccm) | $N_2$ (sccm) | Hexane/ $SiH_4$ | $N_2$/ $SiH_4$ | Hexane/ $N_2$ | Insulative layer |
|---|---|---|---|---|---|---|---|
| 1-1 | 50 | 400 | 500 | 8 | 10 | 0.8 | vertical filling |
| 1-2 | 50 | 285 | 500 | 5.7 | 10 | 0.57 | Conformal + filling in narrow pattern |
| 1-3 | 50 | 200 | 500 | 4 | 10 | 0.4 | Conformal + filling in narrow pattern |
| 1-4 | 50 | 150 | 500 | 3 | 10 | 0.3 | Conformal |

With a small hydrocarbon flow rate as compared to the $SiH_4$ flow rate (a ratio of hexane/$SiH_4$ of less then 8), a limited quantity of hydrocarbon molecules in the plasma saturated the dissociation reaction and recombination reaction. This restricts the surface diffusion and; consequently, a conformal insulative film is more likely to be formed. On the other hand, when the ratio of hexane/$SiH_4$ is 8 and over, a complete or partial bottom-up or vertical filling is more likely to be formed. As with the ratio of hexane/$SiH_4$, the ratio of hexane/$N_2$ is also a parameter controlling the formation type.

EXAMPLE 2

An insulative layer 3 was formed by introducing $SiH_4$, TMDSZ and $NH_3$ into a reaction chamber for CVD processing wherein a semiconductor substrate 2 having trenches 8 was placed. The trenches included relatively wide trenches (a width of 500 nm and a depth of 350 nm) and relatively narrow trenches (a width of 50 nm and a depth of 350 nm). The flow rates of $SiH_4$, n-hexane, and nitrogen gas are shown in Table 2. No oxidizing gas was used. RF power (a frequency of 13.56 MHz, 200 W) was applied to generate plasma over the substrate 2. The $SiH_4$ and TMDSZ reacted in the presence of the $NH_3$ gas on the surface of the semiconductor substrate 2 having the trenches 8 to form the insulative layer 3. The semiconductor substrate 2 may be maintained at a temperature ranging from approximately 0° C. to 200° C. by placing the semiconductor substrate 2 on a chuck maintained at that temperature. In this example, the semiconductor substrate 2 may be maintained at a temperature of approximately 30° C. The reaction chamber may be maintained at a pressure ranging from approximately 2 Torr to approximately 10 Torr (in this example, at approximately 5 Torr). The thickness of the deposited film (as measured on a flat surface) was from 30 nm to 300 nm. After completion of the deposition, the trenches were observed with a scanning electron microscope.

The process conditions and the formation type of resultant insulative layer are indicated in Table 2. As shown in Table 2, the TMDSZ flow rate relative to the $SiH_4$ flow rate and the $NH_3$ flow rate affects the formation type of depositing film.

With a small flow rate of TMDSZ as compared to the flow rate of $SiH_4$ (a ratio of TMDSZ/$SiH_4$ is less than 1.0), a limited quantity of organosilazane molecules in the plasma saturates the dissociation reaction and recombination reaction. This restricts the surface diffusion and; consequently, a conformal insulative film is likely to be formed. On the other hand, the ratio of TMDSZ/$SiH_4$ is 1.0 and over, complete or partial (bottom-up) filling is more likely to be formed. As with the ratio of TMDSZ/SiH$_4$, the ratio of TMDSZ/NH$_3$ is also a parameter controlling the formation type. The ratio of NH$_3$/SiH$_4$ is also a parameter controlling the formation type in a different direction.

Figure 4:
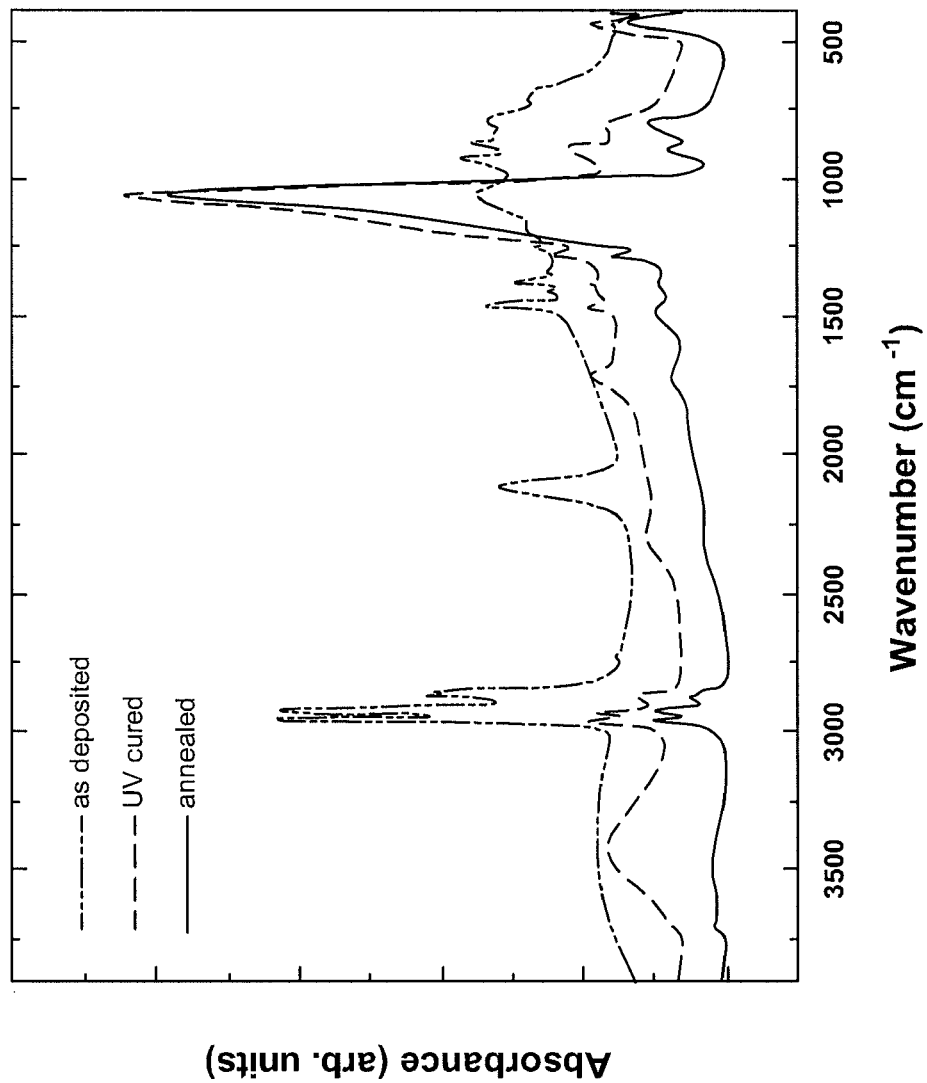

000 cm$^{-1}$) as compared to the insulative layers that were just UV exposed for the same amount of time (FIG. 4).

Figure 3:
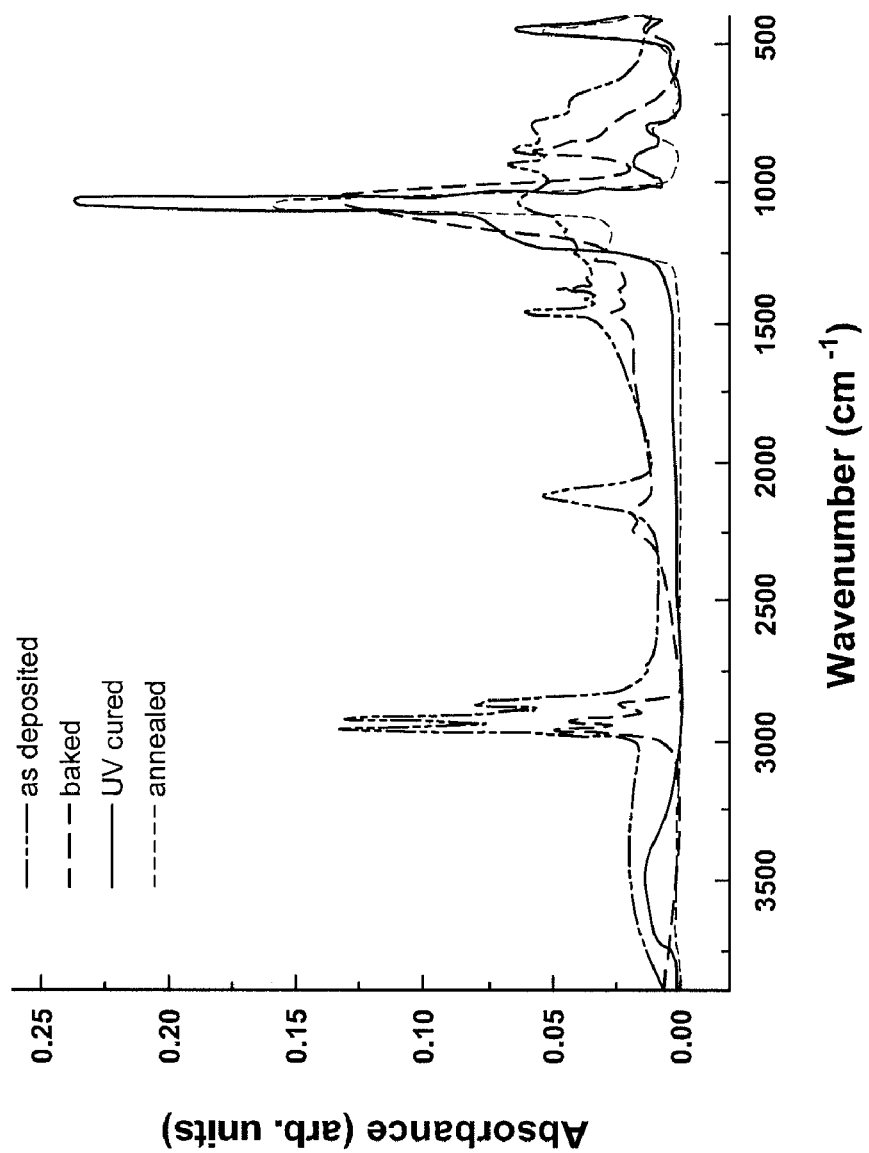
FIGS. 3 and 4 show FTIR spectra of multi-step, cured, insulative layers according to embodiments of the present invention, wherein FIG. 4 show the results of the multi-step curing without baking.
Figure 5A:
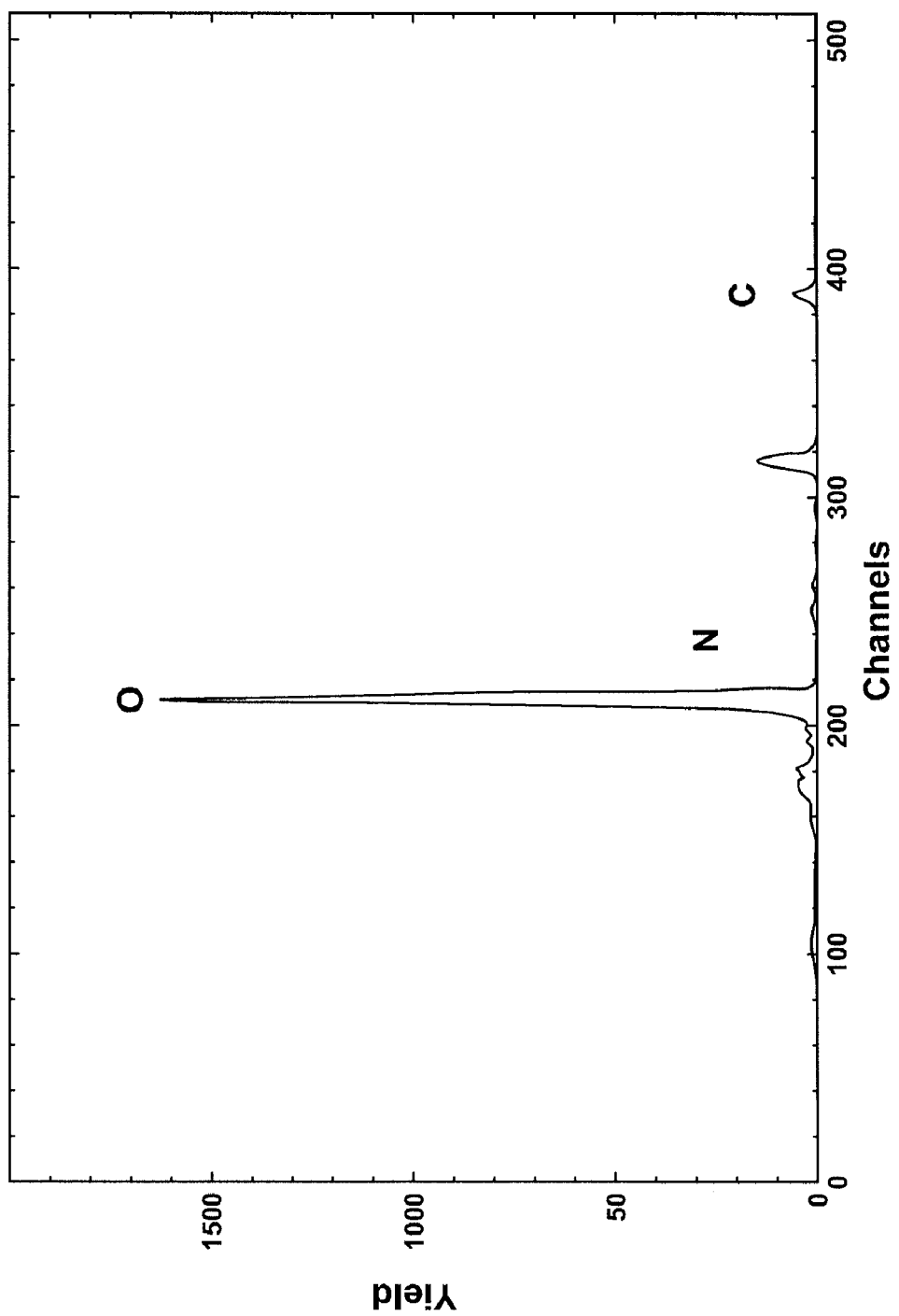
FIGS. 5A and 5B show carbon levels of insulative layers with multi-step curing corresponding to the results shown in FIG. 3.
Figure 5B:
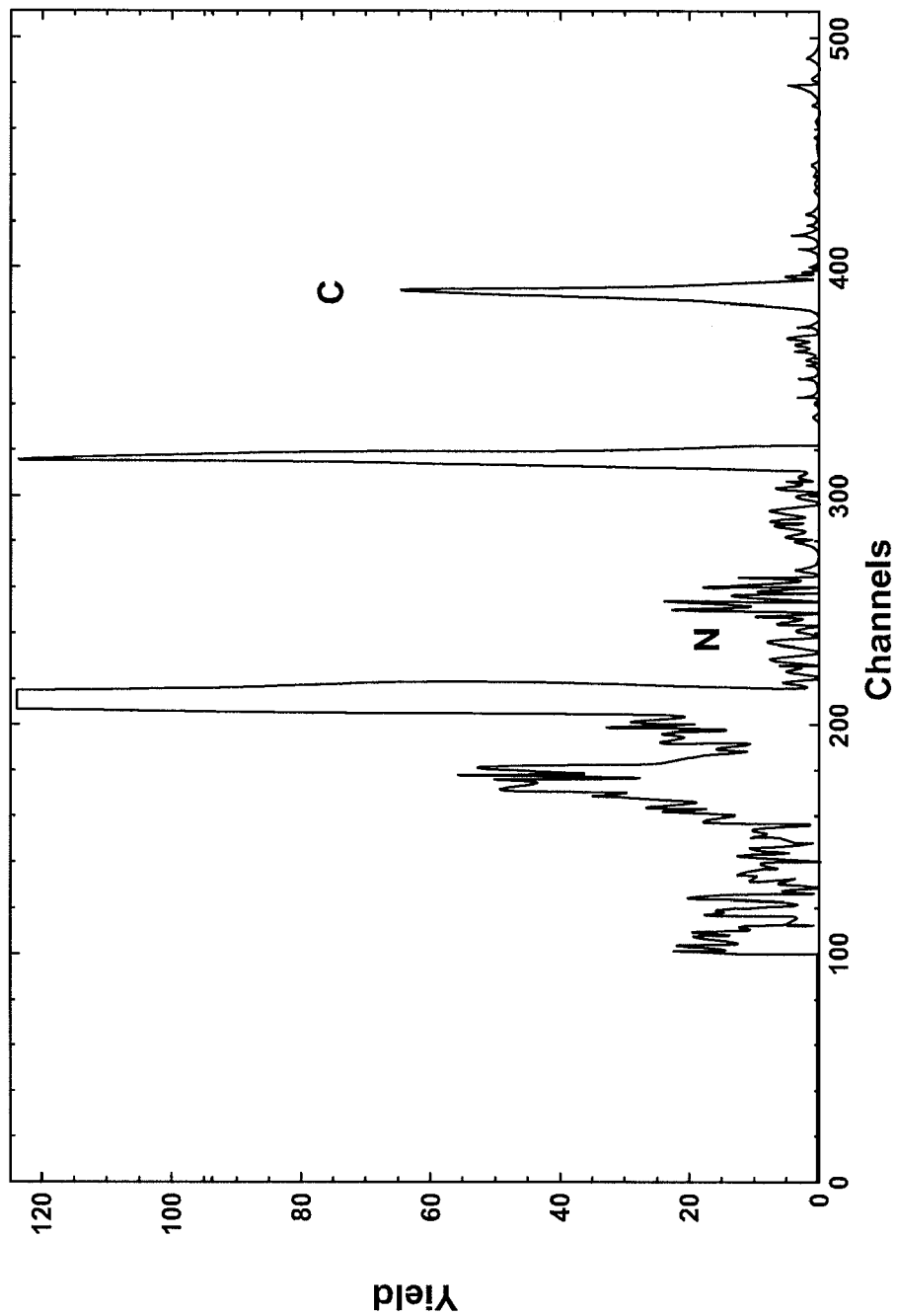

FIGS. 5A and 5B show nuclear reaction analysis (NRA) results of multi-step curing consisting essentially of the baking, UV irradiation and annealing in sequence (corresponding to FIG. 3). FIG. 5B is a detailed view of FIG. 5A, enlarging the lower yield ranges. As shown in FIGS. 5A and 5B, concentrations of hydrogen, carbon, nitrogen, oxygen and silicon is 3.7% (atomic %), 1.0% (atomic %), 0.4% (atomic %), 64.1% (atomic %) and 30.8% (atomic %), respectively. By using a combination of the baking, UV irradiation, and thermal annealing, the carbon content can drastically be reduced.

TABLE 2

| Example | SiH$_4$ (sccm) | TMDSZ (sccm) | NH$_3$ (sccm) | TMDSZ/ SiH$_4$ | NH$_3$/ SiH$_4$ | TMDSZ/ NH$_3$ | Insulative layer |
|---------|----------------|--------------|---------------|----------------|-----------------|----------------|------------------|
| 2-1 | 40 | 80 | 50 | 2 | 1.25 | 1.6 | Vertical filling |
| 2-2 | 40 | 40 | 50 | 1 | 1.25 | 0.8 | Vertical filling |
| 2-3 | 40 | 20 | 50 | 0.5 | 1.25 | 0.4 | Conformal + filling in narrow pattern |
| 2-4 | 40 | 20 | 100 | 0.5 | 2.5 | 0.2 | Conformal + filling in narrow pattern |
| 2-5 | 40 | 20 | 200 | 0.5 | 5 | 0.1 | Conformal |

The skilled artisan will appreciate that based on the device isolation technology described herein, appropriate gases and their flow ratios can be determined and modified for the target formation type of depositing film (conformal coating or vertical growth). Different types of deposition can thus be achieved using the same deposition equipment and even the same precursors.

EXAMPLE 3

To determine the chemical bonding and compositions of multi-step cured insulative layers, the insulative layers 3 were deposited on a blanket wafer by PECVD at 30° C. according to the processes described in Example 1. The multi-step curing was comprised of oxygen-containing treatment (baking), oxygen UV curing, and thermal annealing, which were conducted as follows:

Baking:
Oxygen gas: 3 slm
Nitrogen gas: 1 slm
Temperature: 400° C.
Duration: 1 minute
Pressure: 800 Pa
UV Curing:
UV lamp: Xe lamp (100 mW/cm$^2$)
Oxygen gas: 3 slm
Nitrogen gas: 1 slm
Temperature: 430° C.
Duration: 2 minutes
Pressure: 1200 Pa
Thermal Annealing:
Oxygen gas: 3 slm
Nitrogen gas: 1 slm
Temperature: 430° C.
Duration: 30 minutes
Pressure: 800 Pa FIGS. 3 and 4 are Fourier-transform infrared absorption spectra (FTIR) analysis of insulative layers 3 deposited as described above. FIG. 3 shows the as-deposited results, as well as the results of sequential treatments consisting essentially of the baking, UV curing, and thermal annealing, in sequence, whereas FIG. 4 shows the as-deposited results, as well as the results of sequential treatments consisting essentially of the oxygen UV curing and annealing (i.e., no baking).

As shown FIGS. 3 and 4, the insulative layers that were baked and UV exposed had significantly reduced (FIG. 3) amounts of carbon (at a wave number of about 2,800 cm$^{-1}$~3, The present invention includes the above mentioned embodiments and other various embodiments including the following:

1) A method of forming a conformal and/or flowable, insulative layer on intermediate semiconductor device structure, comprising: providing a conformal and/or flowable, insulative layer comprising silicon, carbon, hydrogen, nitrogen, oxygen or a combination of two or more thereof, and providing a semiconductor substrate comprising at least one trench; forming an insulative layer in the at least one trench; depositing a conformal and/or flowable, insulative layer at least one trench by plasma enhanced chemical vapor deposition.

2) The method of 1), wherein forming an insulative layer in the at least one trench comprises depositing a conformal and/or flowable, insulative material comprising silicon, carbon, hydrogen, nitrogen, oxygen or a combination of two or more thereof in the at least one trench.

3) The method of 2), wherein depositing a conformal and/or flowable, insulative material comprising silicon, carbon, hydrogen, nitrogen, oxygen or a combination of two or more thereof in the at least one trench comprises conformal depositing in the at least one trench with the conformal and/or flowable, insulative material by controlling an amount of silicon, carbon, hydrogen, and nitrogen.

4) The method of 3), wherein conformal depositing is carried out with a ratio of solvent/SiH$_4$ of less than 8.

5) The method of 3), wherein conformal depositing is carried out with a ratio of organosilicon/SiH$_4$ of less than 1.

6) The method of 2), wherein depositing a conformal and/or flowable, insulative material comprising silicon, carbon, hydrogen, nitrogen, oxygen or a combination of two or more thereof in the at least one trench comprises completely filling and/or partially filling the at least one trench with the conformal and/or flowable, insulative material by controlled amount of silicon, carbon and nitrogen.

7) The method of 6), wherein completely filling and/or partially filling is carried out with a ratio of solvent/SiH$_4$ of 8 or more.

8) The method of 6), wherein completely filling and/or partially filling is carried out with a ratio of organosilicon/ $SiH_4$ of 1 or more.

9) The method of 1), wherein depositing a conformal and/or flowable, insulative layer in at least one trench by plasma enhanced chemical vapor deposition, comprising; applying RF power between approximately 10 Watts and approximately 1000 Watts; and a reactant chamber pressure between approximately 0.1 Torr and approximately 10 Torr; and a semiconductor substrate temperature between approximately 0° C. and approximately 200° C.

10) The method of 1), wherein depositing a conformal and/or flowable, insulative layer in at least one trench by plasma enhanced chemical vapor deposition comprises flowing an organic silicon precursor and an oxidizing agent over the semiconductor substrate.

11) A method of removing residual carbon deposits from conformal and/or flowable, insulative layer, comprising: providing a conformal and/or flowable, insulative layer comprising silicon, carbon, hydrogen, nitrogen, oxygen or a combination of two or more thereof, and treating the conformal and/or flowable, insulative layer under multi-step cures that consist essentially of an oxygen-containing treatment, a UV irradiation and annealing in sequence to remove residual carbon deposits from the conformal and/or flowable, insulative layer.

12) The method of 11), wherein providing conformal and/or flowable, insulative layer comprises depositing the conformal and/or flowable, insulative layer by plasma enhanced chemical vapor deposition.

13) The method of 11), wherein providing conformal and/or flowable, insulative layer comprises providing a spin-on, flowable oxide material.

14) The method of 11), wherein said oxygen-containing treatment comprises nitrogen/oxygen, hydrogen/oxygen and $H_2O$/oxygen steam treating the conformal and/or flowable, insulative layer at temperature of between approximately 100° C. and 400° C.

15) The method of 11), wherein said UV irradiation and annealing are performed under a nitrogen and/or oxygen ambience.

16) The method of 15), wherein said nitrogen and/or oxygen ambience may be established to introduce nitrogen into the reaction chamber at a rate of at least 10 sccm and up to a rate of approximately 5,000 sccm, and/or introduce oxygen into the reaction chamber at a rate of at least 10 sccm and up to a rate of approximately 10,000 sccm.

17) The method of 1), wherein said UV irradiation comprises UV irradiation treating the conformal and/or flowable, insulative layer with wave length ranging between approximately 130 nm and approximately 400 nm.

18) The method of 17), wherein UV irradiation treating the conformal and/or flowable, insulative layer at temperature of between approximately 0° C. and 500° C.

19) The method of 11), wherein said annealing comprises thermal treating the conformal and/or flowable, insulative layer at temperature of between approximately 100° C. and 500° C.

20) A method of treating an intermediate semiconductor device structure to remove carbon deposits, comprising; providing a semiconductor substrate comprising at least one trench; depositing a flowable oxide material in the at least one trench; and introducing multi-step cures that consists essentially oxygen-containing treatment, UV irradiation and annealing in sequence to remove residual carbon deposits present in the flowable oxide material.

21) The method of 20), wherein depositing a flowable oxide material in the at least one trench comprises depositing the flowable oxide material comprising silicon, nitride, carbon, hydrogen, oxygen or combination of two or more thereof in the at least one trench.

The method of 20), wherein depositing a flowable oxide material in the at least one trench comprises forming an insulative layer by plasma enhanced chemical vapor deposition, chemical vapor deposition, or spin-on.

23) The method of 22), wherein forming an insulative layer by plasma enhanced chemical vapor deposition comprises introducing an organic silicon precursor and an oxidizing agent over the semiconductor substrate.

24) The method of 20), wherein the oxygen-containing treatment comprises nitrogen/oxygen, hydrogen/oxygen, or $H_2O$/oxygen steam treatment of the conformal and/or flowable, insulative layer at temperature of between approximately 100° C. and 400° C.

25) The method of 20), wherein said UV irradiation and annealing are performed under nitrogen and/or oxygen ambient.

26) The method of 25), wherein nitrogen and/or oxygen ambient comprises flowing into the reaction chamber at a rate of at least 10 standard cubic centimeters per minute and up to a rate of approximately 5,000 standard cubic centimeters per minute in nitrogen, and/or flowing into the reaction chamber at a rate of at least 10 standard cubic centimeters per minute and up to a rate of approximately 10,000 standard cubic centimeters per minute in oxygen.

27) The method of 20), wherein said UV irradiation comprises UV irradiation treating the insulative layer with wave length ranging between approximately 130 nm and approximately 400 nm.

28) The method of 27), wherein the UV irradiation treats the insulative layer at temperature of between approximately 0° C. and 500° C.

29) The method of 20), wherein said annealing comprises thermal treating the insulative layer at temperature of between approximately 100° C. and 500° C.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a conformal and/or gap-filling insulative layer on a semiconductor substrate having at least one trench, comprising:

providing a silicon-containing gas, a nitrogen-containing gas, and a carbon-containing gas as a process gas, said process gas being capable of filling the trench by forming a flowable, insulative material by plasma reaction at first flow rates of the silicon-containing gas, the nitrogen-containing gas, and the carbon-containing gas;

decreasing a ratio of the first flow rate of the carbon-containing gas to the first flow rate of the silicon-containing gas and/or a ratio of the first flow rate of the carbon-containing gas to the first flow rate of the nitrogen-containing gas;

forming a conformal/flowable, insulative material by plasma reaction at the decreased flow rate(s), thereby forming a conformal coating in the trench as a result of the step of decreasing the ratio(s); and multi-step post deposition treatment after the step of forming the conformal/flowable, insulative material, said multi-step post deposition treatment comprising heating the substrate including the conformal coating in the presence of oxygen, irradiating the heated substrate with UV light in the presence of oxygen, and annealing the UV irradiated substrate, thereby removing carbon from the conformal coating as a result of the multi-step post deposition treatment.

2. The method according to claim 1, wherein the step of decreasing the ratio(s) comprises decreasing the first flow rate of the carbon-containing gas to a second flow rate of the carbon-containing gas.

3. The method according to claim 1, wherein the substrate has two or more trenches having different sizes, and the step of decreasing the ratio(s) comprises decreasing the ratio(s) so as to form the conformal coating in trench(es) having a width greater than that of other trench(es) while vertically filling the other trench(es) with the conformal/flowable, insulative material in the step of forming the conformal/flowable, insulative material, wherein the ratio(s) controls whether the conformal/flowable, insulative material creates conformal coating or gap-filling in each trench.

4. The method according to claim 1, wherein solely by the step of decreasing the ratio(s), the conformal/flowable, insulative material is controlled to form the conformal coating in the step of forming the conformal/flowable, insulative material.

5. The method according to claim 1, wherein the silicon-containing gas is $Si_nH_{2n+2}$ wherein n is an integer.

6. The method according to claim 1, wherein the carbon-containing gas is an organic solvent.

7. The method according to claim 6, wherein the silicon-containing gas is $SiH_4$ and the step of decreasing the ratio(s) comprises decreasing the ratio of solvent/$SiH_4$ to less than 8.

8. The method according to claim 1, wherein the carbon-containing gas is an organosilicon precursor.

9. The method according to claim 8, wherein the silicon-containing gas is $SiH_4$ and the step of decreasing the ratio(s) comprises decreasing the ratio of organosilicon precursor/$SiH_4$ to less than 1.

10. The method according to claim 1, wherein the nitrogen-containing gas is $N_2$ or $NH_3$.

11. The method according to claim 1, wherein the step of forming the conformal/flowable, insulative material is conducted by plasma enhanced chemical vapor deposition at an RF power of between about 10 W and about 1,000 W, a pressure of between about 0.1 Torr and about 10 Torr, and a temperature of between about 0° C. and about 200° C.

12. The method according to claim 1, wherein the conformal/flowable, insulative material comprises silicon, carbon, hydrogen, nitrogen, and oxygen.

13. The method according to claim 1, wherein the carbon content in the conformal coating is 1 atomic % or less as a result of the multi-step post deposition treatment.

14. The method according to claim 1, wherein the UV irradiation and the annealing are performed under a nitrogen and/or oxygen ambience.

15. A method of forming a conformal and/or gap-filling insulative layer on a semiconductor substrate having at least one trench, comprising:
    forming a conformal/flowable, insulative material in the trench by plasma enhanced chemical vapor deposition, chemical vapor deposition, or spin-on; and
    conducting multi-step post deposition treatment comprising heating the substrate in the presence of oxygen, wherein the oxygen-containing treatment comprises exposing the substrate to nitrogen/oxygen, hydrogen/oxygen, or $H_2O$/oxygen steam at temperature of about 100° C. to about 400° C., irradiating the heated substrate with UV light in the presence of oxygen, and annealing the UV irradiated substrate, wherein the UV irradiation comprises irradiating the substrate with UV light having a wavelength of about 130 nm to about 400 nm at a temperature of about 0° C. to about 500° C., thereby removing carbon from the conformal/flowable material as a result of the multi-step post deposition treatment.

16. The method according to claim 15, wherein the annealing comprises thermal treating the substrate at a temperature of about 100° C. to about 500° C. in a nitrogen ambience.

* * * * *

UNITED STATES PATENT AND TRADEMARK OFFICE
CERTIFICATE OF CORRECTION

PATENT NO. : 7,622,369 B1 Page 1 of 1
APPLICATION NO. : 12/130522
DATED : November 24, 2009
INVENTOR(S) : Lee et al.

It is certified that error appears in the above-identified patent and that said Letters Patent is hereby corrected as shown below:

At Column 7, Line 52, delete "m" and insert -- nm --, instead.

At Column 10, Line 36 (Approx.), delete "thereof," and insert -- thereof; --, instead.

At Column 11, Line 21, delete "thereof," and insert -- thereof; --, instead.

At Column 11, Line 49, delete "1)," and insert -- 11), --, instead.

At Column 12, Line 6, before "The" insert -- 22) --.

Signed and Sealed this

Twenty-ninth Day of June, 2010

David J. Kappos
*Director of the United States Patent and Trademark Office*